United States Patent [19]

Stevens et al.

[11] Patent Number: 4,853,016

[45] Date of Patent: Aug. 1, 1989

[54] PROCESS FOR CONSOLIDATION OF SILICON MONOXIDE FINES

[75] Inventors: Chad I. Stevens, Stratham, N.H.; Edward D. Parent, Hamilton, Mass.

[73] Assignee: GTE Products Corporation, Stamford, Conn.

[21] Appl. No.: 229,679

[22] Filed: Aug. 8, 1988

[51] Int. Cl.$^4$ .............................................. C03B 5/00
[52] U.S. Cl. ...................................... 65/18.1; 65/18.4; 423/325
[58] Field of Search ................. 423/325; 65/18.1, 18.4

[56] References Cited

U.S. PATENT DOCUMENTS 3,728,436  4/1973  Krikorov et al. .................. 423/325

Primary Examiner—Peter Kratz
Attorney, Agent, or Firm—James Theodosopoulos

[57] ABSTRACT

Silicon monoxide grains finer than 10 mesh are vacuum hot pressed to form a glass billet which can than be used to provide silicon monoxide of a size and/or shape suitable for vapor deposition purposes.

5 Claims, No Drawings

PROCESS FOR CONSOLIDATION OF SILICON MONOXIDE FINES

This invention concerns silicon monoxide which can be used for vapor deposition purposes. Examples of such vapor deposition are shown in U.S. Pat. Nos. 4,485,124 and 4,497,539. An example of a form of silicon monoxide used in a thermal evaporator is shown in U.S. Pat. No. 3,010,839.

This invention is particularly concerned with silicon monoxide granules used in thermal evaporators, say, in a preferred grain size range of 10 mesh to ⅜ inch. In the manufacture of such grains, a portion thereof are of such fine particle size that they absorb excessive amounts of oxygen and other gases on their surface and thus become unusable for thermal evaporation due to excessive spitting. In the past, such fines have been discarded. This invention provides a means of making such fines usable.

Silicon monoxide is purchased in the coke like granular form suitable for thermal evaporation. One such supplier is Alfa Division, Ventron Corporation, Danvers, Mass. The silicon monoxide is screened to remove all grains finer than 10 mesh, which are then loaded into a punch and die assembly, and are vacuum hot pressed at about 1200° C. to form a glass billet. The glass billet is then broken up into a coarse aggregate of the desired size, say, 10 mesh to ⅜ inch. Finer material can be separated out and processed again as per this invention. If desired, the glass billet, instead of being broken up into a coarse aggregate, can be cut into large standing shapes for use in sublimation type evaporation sources or as sputter targets.

In a specific example of the production of this material, 43.6 kg of SiO fines of minus 10 mesh were loaded into a 13.1" diameter graphite punch and die assembly. Boron nitride coating and graphite foil were used to keep SiO from sticking to graphite tooling. The punch and die assembly were loaded into a vacuum hot press chamber for processing. After the chamber was pumped down to 50 to 80 microns ($10^{-1}$ Torr), heat was applied. At approximately 900° C., pressure was applied until 1200° C. and 1250 psi was attained. The press run cycle at this point was 5 hours. After 16 hours cooling the SiO billet was unloaded from punch and die assembly.

The final billet dimensions were 13.14" diameter, 9.53" high with a weight of 43,640 grams. The calculated percent of theoretical density was 96.7%. The billet material was then comminuted to smaller grain sizes for use in thermal evaporation devices by jaw crushing and screening to obtain grains 10 mesh to ⅜ inch size.

An example of a sublimation type evaporation source is a cylinder 1" diameter by 4" high.

An example of a sputter target is a disc 8" diameter by ¼" thick.

We claim:

1. The process of consolidating silicon monoxide fines for use in vapor deposition comprising the steps of screening silicon monoxide granular material to separate out grains finer than 10 mesh, and vacuum hot pressing the minus 10 mesh silicon monoxide material at a high enough temperature and pressure to form a glass billet.

2. The process of claim 1 wherein the glass billet is comminuted to granular silicon monoxide for use in thermal evaporation devices.

3. The process of claim 1 wherein the glass billet is machined into standing shapes for use as sputter targets or sublimation forms.

4. The process of claim 2 wherein the comminuted granular silicon monoxide is screened to remove minus 10 mesh grains.

5. The process of claim 1 wherein the minus 10 mesh silicon monoxide material is vacuum hot pressed in graphite tools at a vacuum of about $10^{-1}$ Torr, a pressure of about 1250 psi and a temperature of about 1200° C.

* * * * *